United States Patent
Ha

(10) Patent No.: US 12,025,912 B2
(45) Date of Patent: Jul. 2, 2024

(54) PHASE SHIFT MASK FOR EUV LITHOGRAPHY AND MANUFACTURING METHOD FOR THE PHASE SHIFT MASK

(71) Applicant: SK hynix Inc., Icheon-si (KR)

(72) Inventor: Tae Joong Ha, Icheon-si (KR)

(73) Assignee: SK hynix inc., Icheon-si (KR)

( * ) Notice: Subject to any disclaimer, the term of this patent is extended or adjusted under 35 U.S.C. 154(b) by 118 days.

(21) Appl. No.: 17/529,071

(22) Filed: Nov. 17, 2021

(65) Prior Publication Data

US 2022/0397818 A1    Dec. 15, 2022

(30) Foreign Application Priority Data

Jun. 15, 2021 (KR) .................. 10-2021-0077710

(51) Int. Cl.
*G03F 1/30* (2012.01)
(52) U.S. Cl.
CPC ..................... *G03F 1/30* (2013.01)
(58) Field of Classification Search
CPC ..... G03F 1/30; G03F 1/32; G03F 1/42; G03F 1/24; G03F 1/26
See application file for complete search history.

(56) References Cited

U.S. PATENT DOCUMENTS

| | | | | |
|---|---|---|---|---|
| 2006/0240334 A1* | 10/2006 | Huh | ............ | G21K 1/062 430/5 |
| 2009/0220869 A1* | 9/2009 | Takai | ............ | B82Y 10/00 430/5 |
| 2011/0059391 A1* | 3/2011 | Shoki | ............ | G03F 1/26 430/5 |
| 2018/0143527 A1* | 5/2018 | Seo | ............ | G03F 1/24 |
| 2019/0079383 A1* | 3/2019 | Ikebe | ............ | G03F 1/32 |
| 2020/0057363 A1* | 2/2020 | Hsu | ............ | G03F 1/24 |
| 2020/0073225 A1* | 3/2020 | Shih | ............ | G03F 1/24 |

FOREIGN PATENT DOCUMENTS

KR          101581977 B1     12/2015

* cited by examiner

*Primary Examiner* — Mark F. Huff
*Assistant Examiner* — Moriah S. Smoot
(74) *Attorney, Agent, or Firm* — WILLIAM PARK & ASSOCIATES LTD.

(57) ABSTRACT

There is provided a phase shift mask for extreme-ultraviolet lithography and a method of manufacturing the phase shift mask. The phase shift mask includes a substrate, a reflective layer, device patterns, a frame pattern, or phase shift patterns. The frame pattern is a pattern that includes alignment holes exposing portions of the reflective layer. The phase shift patterns overlap with the device patterns.

14 Claims, 10 Drawing Sheets

PHASE SHIFT MASK FOR EUV LITHOGRAPHY AND MANUFACTURING METHOD FOR THE PHASE SHIFT MASK

CROSS-REFERENCE TO RELATED APPLICATIONS

The present application claims priority under 35 U.S.C 119(a) to Korean Applications No. 10-2021-0077710, filed on Jun. 15, 2021, which is incorporated herein by reference in its entirety.

BACKGROUND

1. Technical Field

The present disclosure relates to a lithography technology, and more particularly, to a phase shift mask for extreme ultraviolet (EUV) lithography and a manufacturing method of the phase shift mask.

2. Related Art

As semiconductor integrated circuits are being integrated with finer-sized patterns, exposure light sources of shorter wavelength bands are required for lithography processes. In order to implement a fine circuit line width, a technique using extreme ultraviolet (EUV) in a wavelength band of approximately 13.5 nanometers (nm) as exposure light is being recognized. In the extreme ultraviolet lithography technology, a reflective mask structure is applied. In order to improve the resolution by extreme ultraviolet, a phase shift mask structure in which a phase shift structure is applied to the reflective mask structure has been tried.

SUMMARY

An embodiment of the present disclosure may provide a phase shift mask including a reflective layer formed on a substrate, device patterns formed on the reflective layer, a frame pattern formed on the reflective layer, the frame pattern including alignment holes exposing portions of the reflective layer, and phase shift patterns overlapping with the device patterns.

Another embodiment of the present disclosure may provide a method of manufacturing a phase shift mask including: forming a reflective layer on a substrate; forming a lower layer on the reflective layer; forming an upper layer for phase shift on the lower layer; patterning first phase shift patterns and a second phase shift pattern providing alignment holes from the upper layer for phase shift by sequentially etching the upper layer for phase shift and the lower layer and patterning device patterns overlapping with the first phase shift patterns and a frame pattern overlapping with the second phase shift patterns from the lower layer; and selectively removing the second phase shift pattern.

DETAILED DESCRIPTION

Figure 1:
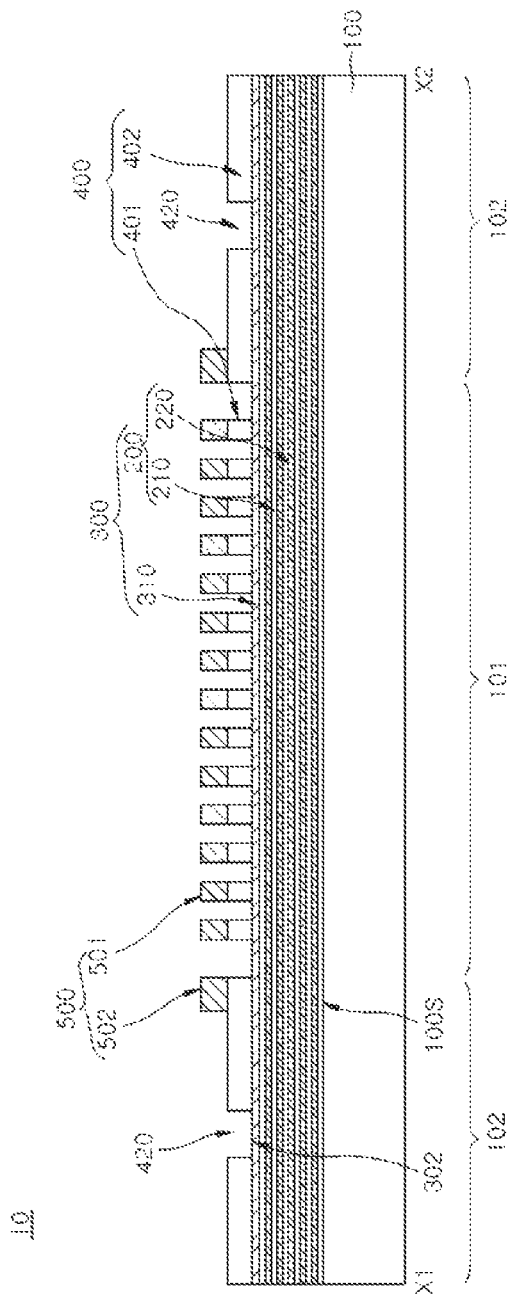
FIGS. 1 and 2 are schematic views illustrating a phase shift mask for extreme ultraviolet lithography according to an embodiment of the present disclosure.

The terms used in the description of the embodiments of the present disclosure are terms selected in consideration of functions in the presented embodiments, and the meaning of the terms may vary according to the intention or custom of users or operators in the technical field. The meanings of the terms used are in accordance with the defined definitions when specifically defined in the present disclosure, if there is no specific definition, it may be interpreted as the meaning generally recognized by those skilled in the art.

In the description of the embodiments of the present disclosure, descriptions such as "first", "second", "side", "top" and "bottom or lower" are to distinguish subsidiary materials, not used to limit the subsidiary materials themselves or to imply any particular order, and they mean a relative positional relationship, but do not limit a specific case in which the subsidiary material is directly contacted or another subsidiary materials is further introduced into the interface. The same interpretation may be applied to other expressions describing the relationship between components.

The embodiments of the present disclosure may be applied to a technical field for implementing integrated circuits such as DRAM, PcRAM, or ReRAM device. Further, the embodiments of the present disclosure may be applied to a technical field of implementing a memory device such as SRAM, FLASH, MRAM, or FeRAM, or a logic device in which logic integrated circuit is integrated. The embodiments of the present disclosure may be applied to a technical field for implementing various products requiring fine patterns.

The same reference numerals may refer to the same elements throughout the present disclosure. The same reference numerals or similar reference numerals may be described with reference to other drawings, even if they are not mentioned or described in the corresponding drawings. Further, even if a reference numeral is not indicated, it may be described with reference to other drawings.

Figure 2:
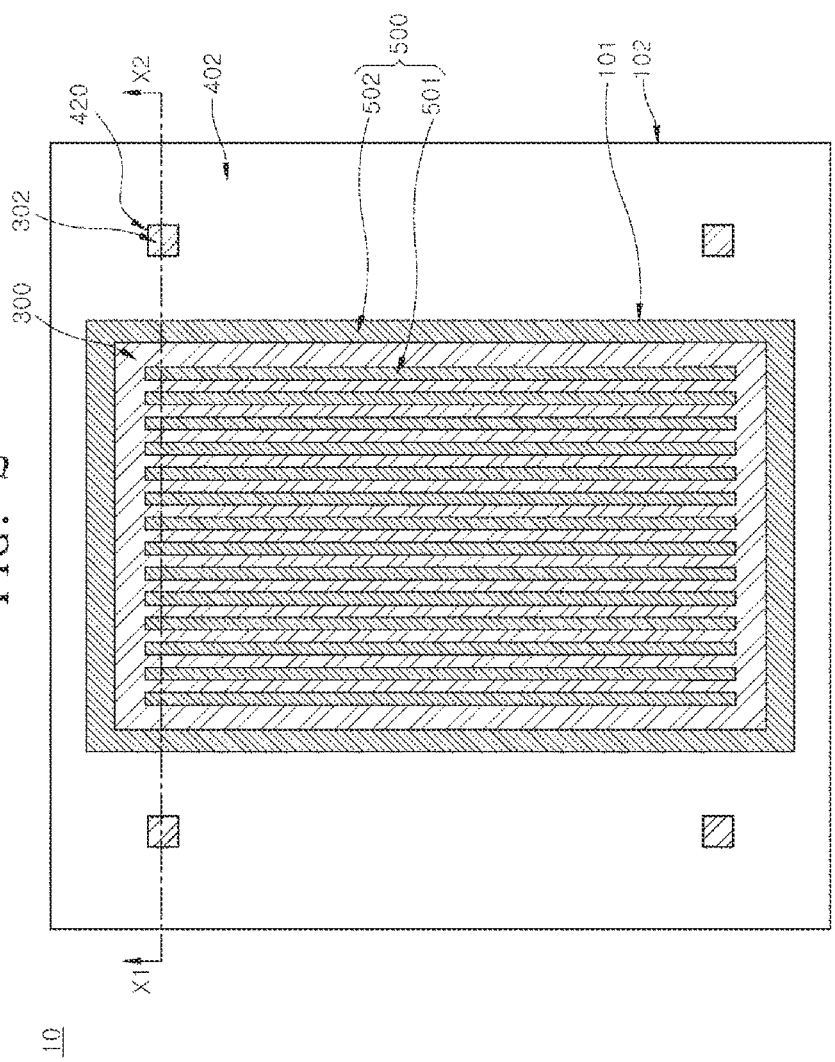

FIG. 1 is a schematic cross-sectional view illustrating a cross-sectional shape of a phase shift mask 10 for extreme ultraviolet lithography according to an embodiment of the present disclosure. FIG. 2 is a schematic plan view illustrating a planar shape of the phase shift mask 10 for extreme ultraviolet lithography according to an embodiment of the present disclosure. FIG. 1 illustrates a cross-sectional shape along the line X1-X2 of FIG. 2.

Referring to FIG. 1, the phase shift mask 10 for extreme ultraviolet lithography may include a substrate 100, a reflective layer 300, a lower layer 400, and an upper layer for phase shift 500. The lower layer 400 may be formed on the reflective layer 300. The lower layer 400 may include device patterns 401 and a frame pattern 402 formed on the reflective layer 300. The upper layer for phase shift 500 may include phase shift patterns 501 and an edge ring pattern 502. The phase shift mask 10 having the above configuration may be used as a photomask in a lithography process using extreme ultraviolet light as a light source.

The phase shift mask 10 may include a reflective photomask structure that reflects incident extreme ultraviolet rays. The reflective layer 300 of the phase shift mask 10 may be formed on the substrate 100. The reflective layer 300 may be formed to cover an upper surface 100S of the substrate 100. The substrate 100 may be a base on which the reflective layer 300 is formed. The substrate 100 may include a material having a low thermal expansion material (LTEM). The substrate 100 may include quartz, alumina silicate glass, or silicon oxide-titanium oxide ($SiO_2$—$TiO_2$) based glass.

The reflective layer 300 of the phase shift mask 10 may be a layer having a structure that reflects extreme ultraviolet rays in, for example, a wavelength band of 13.5 nm. The reflective layer 300 may have a layer structure that implements a reflectivity of about 58% to 60% with respect to the incident extreme ultraviolet rays. The reflective layer 300 may include a multi-layer 200 in which a first reflective layer 210 and a second reflective layer 220 are alternately stacked a plurality of times. The first and second reflective layers 210 and 220 may be material layers having different refractive indices n with respect to extreme ultraviolet. The multi-layer 200 in which the first and second reflective layers 210 and 220 are alternately and repeatedly stacked may constitute a mirror structure that reflects incident extreme ultraviolet rays. The first reflective layer 210 may include a silicon (Si) layer, and the second reflective layer 220 may include a molybdenum (Mo) layer.

The reflective layer 300 may further include a capping layer 310 covering the multi-layer 200. The capping layer 310 may protect the multi-layer 200 by covering an upper surface of the multi-layer 200 to prevent or mitigate defects from occurring in the multi-layer 200 from the external environment. The capping layer 310 may be formed of a material having a low extinction coefficient k with respect to extreme ultraviolet, for example, a material having an extinction coefficient of 0.005 to 0.04. The capping layer 310 may include a ruthenium (Ru) layer.

The device patterns 401 and the frame pattern 402 may be formed on the reflective layer 300 to be spaced apart from each other. The device patterns 401 and the frame pattern 402 may be positioned at the same level. The device patterns 401 and the frame pattern 402 may be patterned from the lower layer 400 to be separated from each other. The device patterns 401 may be positioned to overlap with a first region 101 of the substrate 100. The frame pattern 402 may be positioned to overlap with a second region 102 of the substrate 100. The first region 101 of the substrate 100 may be a central portion of the substrate 100, and the second region 102 of the substrate 100 may be an edge region surrounding the first region 101.

Referring to FIGS. 1 and 2 together, the device patterns 401 may be image transfer patterns having images that are to be transferred onto a wafer by an extreme ultraviolet lithography process. The first region 101 of the substrate 100 may be a region in which patterns to be transferred onto a wafer by an extreme ultraviolet lithography process are disposed. The second region 102 of the substrate 100 may be a region in which an image is prohibited from being transferred onto a wafer by an extreme ultraviolet lithography process. The frame pattern 402 may be a pattern having an image that is prohibited from being transferred onto a wafer by an extreme ultraviolet lithography process.

The device patterns 401 may be patterns having a relatively small line width compared to the frame pattern 402. The frame patter 402 may have a ring shape or as a loop shape surrounding the device patterns 401. In an embodiment, the frame pattern 402 may be formed as a perimeter to surround a group of the device patterns 401 or all of the device patterns 401 as shown in FIGS. 1 and 2. The frame pattern 402 may be a ring-shaped pattern surrounding the first region 101 of the substrate 100. The frame pattern 402 may block the portion of the reflective layer 300, overlapping with the second region 102 to substantially block the reflection of extreme ultraviolet in the portion of the reflective layer 300, overlapping with the second region 102. As such, the frame pattern 402 may serve to block an image from being transferred from the second region 102 of the substrate 100 onto the wafer.

The frame pattern 402 may be a pattern providing alignment holes 420. The alignment holes 420 may be reference marks or alignment marks for checking a position of the phase shift mask 10 when an extreme ultraviolet lithography process is performed. The alignment holes 420 may be in the form of through holes substantially vertically penetrating the frame pattern 402. The alignment holes 420 may be through holes exposing partial regions of the reflective layer 300 on the bottom.

Figure 3:
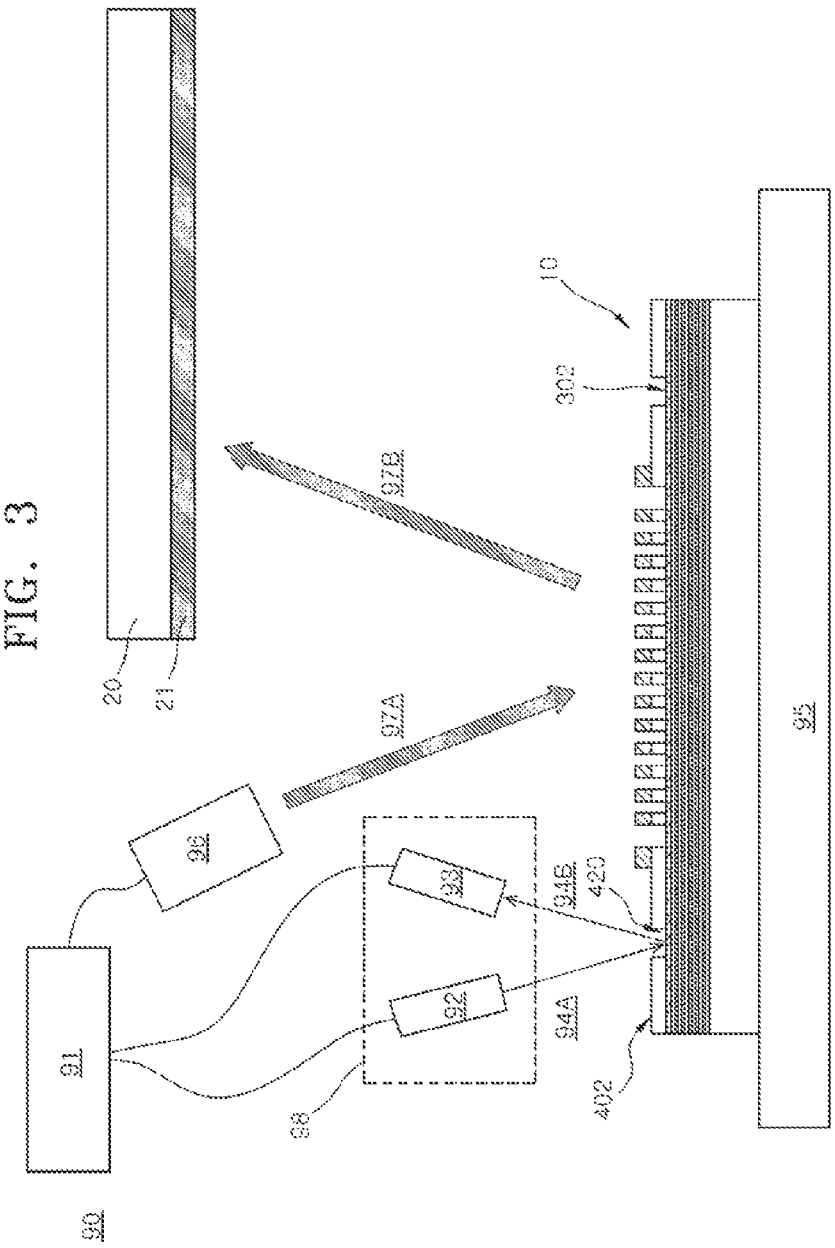
FIG. 3 is a schematic view illustrating an extreme ultraviolet lithography system according to an embodiment of the present disclosure.

FIG. 3 is a schematic view illustrating an extreme ultraviolet lithography system 90 according to an embodiment of the present disclosure.

Referring to FIGS. 2 and 3 together, the system 90 by which the EUV lithography process is performed may include a controller 91, an EUV light source unit 96, a position checker 98, and a mask loader 95. A phase shift mask 10 may be loaded on the mask loader 95, and extreme ultraviolet rays 97A generated from the extreme ultraviolet light source unit 96 may be incident onto the phase shift mask 10. The extreme ultraviolet rays 97B may be reflected from the phase shift mask 10, and the reflected extreme ultraviolet rays 97B may be incident onto a resist layer 21 formed on a wafer 20. Accordingly, a pattern image may be transferred from the phase shift mask 10 to the resist layer 21.

After the phase shift mask 10 is loaded onto the mask loader 95, a process of checking the position at which the phase shift mask 10 is loaded may be performed. Inspection light 94A may be irradiated to the phase shift mask 10 from an inspection light source unit 92 of the position checker 98, and the inspection light 94B reflected from the phase shift mask 10 may be received by an inspection light receiver 93. The inspection light 94A may scan the frame pattern 402 and the alignment holes 420 of the phase shift mask 10, and the inspection light receiver 93 may receive the inspection light 94B reflected from the frame pattern 402 and the alignment holes 420.

The frame pattern 402 is formed of a material having a lower reflectivity than the reflective layer 300 with respect to the incident inspection light 94A. Accordingly, the intensity of the inspection light 94B reflected from portions 302 of the reflective layer 300 exposed at the bottom of the alignment holes 420 may be relatively greater than the intensity of the inspection light reflected from the surface of the frame pattern 402. The position of the alignment holes 420 may be checked from the intensity distribution of the reflected inspection light 94B according to the scan direction of the incident inspection light 94A. Because the positions of the alignment holes 420 represent the position of the phase shift mask 10, the position of the phase shift mask 10 may be detected by checking the positions of the alignment holes 420.

In order to distinguish the signal or intensity of the inspection light 94B reflected from the alignment holes 420 or the bottom of the alignment hole 420 from the signal or intensity of the inspection light 94B reflected from the surface of the frame pattern 402, the frame pattern 402 may have a relatively lower reflectivity with respect to the incident inspection light 94A than the reflective layer 300. As the inspection light 94A used in the process of checking the loading position of the phase shift mask 10, a light source of a wavelength range of about 248 nm to about 900 nm may be used. As the inspection light 94A, a light source in a wavelength band of approximately 405 nm or a light source in a wavelength band of approximately 880 nm may be used.

The reflectivity of the frame pattern 402 or the lower layer 400 with respect to the light source in the wavelength range of about 248 nm to about 900 nm may be relatively lower than the reflectivity of the reflective layer 300 with respect to the light source in the wavelength range of about 248 nm to about 900 nm. The reflectivity of the frame pattern 402 or the lower layer 400 with respect to the light source in the wavelength range of about 405 nm and about 880 nm may be relatively lower than the reflectivity of the reflective layer 300 with respect to the light source in the wavelength range of about 405 nm and about 880 nm.

The reflectivity of the frame pattern 402 or the lower layer 400 with respect to the light source in the wavelength band of about 248 nm to about 900 nm may be about 50% or less of the reflectivity of the reflective layer 300 with respect to the light source in the wavelength band of about 248 nm to about 900 nm. The reflectivity of the frame pattern 402 or the lower layer 400 with respect to the light source in the wavelength range of about 405 nm and about 880 nm may be about 50% or less of the reflectivity of the reflective layer 300 with respect to the light source in the wavelength range of about 405 nm and about 880 nm.

The reflectivity of the frame pattern 402 or the lower layer 400 with respect to a light source in a wavelength range of approximately 248 nm to approximately 900 nm may be approximately 2% to 30%. The reflectivity of the frame pattern 402 or the lower layer 400 with respect to a light source in a wavelength band of about 405 nm and a light source in a wavelength band of about 880 nm may be about 2% to 30%.

The reflectivity of the reflective layer 300 with respect to a light source in a wavelength range of approximately 248 nm to approximately 900 nm may be approximately 58% to 60%.

As such, the frame pattern 402 has a relatively significantly low reflectivity with respect to the inspection light 94A than the reflective layer 300, so that the detection and check for the alignment holes 420 may be effectively performed.

Referring again to FIG. 1, the frame pattern 402 or the lower layer 400 may include a low-reflective material layer having a relatively low reflectivity with respect to a light source in a wavelength range of about 248 nm to about 900 nm. The low-reflective material layer or the frame pattern 402 or the lower layer 400 may be formed as a material layer including ruthenium (Ru), silicon (Si), molybdenum (Mo), tantalum (Ta), titanium (Ti), or zirconium (Zr). The frame pattern 402 or the lower layer 400 may be formed as a material layer including at least one of ruthenium (Ru), silicon (Si), molybdenum (Mo), tantalum (Ta), titanium (Ti), and zirconium (Zr). The frame pattern 402 or the lower layer 400 may be formed as a material layer including oxide or nitride of ruthenium (Ru), silicon (Si), molybdenum (Mo), tantalum (Ta), titanium (Ti), and zirconium (Zr). The frame pattern 402 or the lower layer 400 may be formed as a material layer including silicon nitride ($Si_3N_4$), silicon oxide ($SiO_2$), silicon oxynitride (SiON), tantalum oxide ($Ta_2O_5$), titanium oxide ($TiO_2$), hafnium oxide ($HfO_2$), or zirconium oxide ($ZrO_2$). The frame pattern 402 or the lower layer 400 may be formed as a material layer including at least one of silicon nitride ($Si_3N_4$), silicon oxide ($SiO_2$), silicon oxynitride (SiON), tantalum oxide ($Ta_2O_5$), titanium oxide ($TiO_2$), hafnium oxide ($HfO_2$), and zirconium oxide ($ZrO_2$).

It is confirmed that the titanium oxide may have a reflectivity of about 3% with respect to the inspection light of 405 nm wavelength band, and may have a reflectivity of about 24% with respect to the inspection light of 880 nm wavelength band. Accordingly, it may be effective that the frame pattern 402 or the lower layer 400 is formed as a layer of titanium oxide.

It is confirmed that silicon oxide may have a reflectivity of about 22% with respect to the inspection light of 405 nm wavelength band, and may have a reflectivity of about 30% to the inspection light of 880 nm wavelength band. It is confirmed that silicon nitride may have a reflectivity of about 12% with respect to the inspection light of 405 nm wavelength band, and may have a reflectivity of about 28% with respect to the inspection light of 880 nm wavelength band. It is confirmed that the tantalum oxide may have a reflectivity of about 9% with respect to the inspection light of 405 nm wavelength band, and may have a reflectivity of about 28% to the inspection light of 880 nm wavelength band. It is confirmed that hafnium oxide may have a reflectivity of about 15% with respect to the inspection light of 405 nm wavelength band, and may have a reflectivity of about 30% to the inspection light of 880 nm wavelength band. It is confirmed that zirconium oxide may have a reflectivity of about 10% with respect to the inspection light of 405 nm wavelength band, and may have a reflectivity of about 27% with respect to the inspection light of 880 nm wavelength band.

Because the frame pattern 402 or the lower layer 400 includes silicon nitride ($Si_3N_4$), silicon oxide ($SiO_2$), silicon oxynitride (SiON), tantalum oxide ($Ta_2O_5$), titanium oxide ($TiO_2$), hafnium oxide ($HfO_2$), and zirconium oxide ($ZrO_2$), the alignment holes 420 may be more effectively detected by scanning the inspection light (94A in FIG. 3).

The device patterns 401 may be formed to include substantially the same material as the frame pattern 402. The device patterns 401 may include silicon nitride ($Si_3N_4$), silicon oxide ($SiO_2$), silicon oxynitride (SiON), tantalum oxide ($Ta_2O_5$), titanium oxide ($TiO_2$), hafnium oxide ($HfO_2$), or zirconium oxide ($ZrO_2$).

Referring to FIG. 1, the phase shift patterns 501 of the upper layer for phase shift 500 may be formed to overlap with the device patterns 401. The phase shift patterns 501 may be patterned to have substantially the same planar shapes or pattern shapes as the device patterns 401. The phase shift patterns 501 may be aligned with the device patterns 401 and patterned to substantially completely overlap with the device patterns 401.

The edge ring pattern 502 may be formed to be spaced apart from the phase shift patterns 501. The edge ring pattern 502 may be positioned at the same level as the phase shift patterns 501. The edge ring pattern 502 and the phase shift patterns 501 may be patterned to be separated from the upper layer for phase shift 500. The phase shift patterns 501 may be positioned to overlap with the first region 101 of the substrate 100 in the same manner as the device patterns 401. The edge ring pattern 502 may overlap with portions of the frame patterns 402. The edge ring pattern 502 may be positioned to overlap with a portion of the second region 102 of the substrate 100.

The phase shift patterns 501 may serve to improve resolution of the image transferred by the phase shift mask 10. The upper layer for phase shift 500 or the phase shift patterns 501 may be formed as a layer that reflects incident extreme ultraviolet (EUV) rays. The upper layer for phase shift 500 or the phase shift patterns 501 may be formed as a phase shift layer in which the extreme ultraviolet rays reflected by the phase shift patterns 501 or the upper layer for phase shift 500 and the extreme ultraviolet rays reflected by the reflective layer 300 have a phase difference of 180 degrees (°) to 300 degrees (°). The phase shift patterns 501 or the upper layer for phase shift 500 may be formed as a phase shift layer having a reflectivity of 5% to 60% with respect to extreme ultraviolet. The phase shift patterns 501 or the upper layer for phase shift 500 may be formed as a phase shift layer of a material having a refractive index of 0.87 to 0.96 and an extinction coefficient of 0.005 to 0.04 with respect to extreme ultraviolet.

The phase shift patterns 501 or the upper layer for phase shift 500 may include a phase shift layer including at least one of ruthenium (Ru), molybdenum (Mo), niobium (Nb), tantalum (Ta), titanium (Ti), and zirconium (Zr). The phase shift patterns 501 or the upper layer for phase shift 500 may include a phase shift layer including ruthenium (Ru), molybdenum (Mo), niobium (Nb), tantalum (Ta), titanium (Ti), or zirconium (Zr). The phase shift layer may include a composition of at least two or more materials of ruthenium (Ru), molybdenum (Mo), niobium (Nb), tantalum (Ta), titanium (Ti), and zirconium (Zr). The phase shift layer may further include at least one of carbon (C), oxygen (O), and nitrogen (N) as an additive.

The phase shift patterns 501 or the upper layer for phase shift 500 may include a molybdenum (Mo) layer having a thickness of about 60 nm. It is confirmed that the extreme ultraviolet rays reflected from the phase shift patterns 501 of the molybdenum (Mo) layer have a phase difference of about 250 degrees (°) from the extreme ultraviolet rays reflected from the reflective layer 300. It is confirmed that the phase shift patterns 501 of the molybdenum (Mo) layer have a reflectivity of about 40% with respect to extreme ultraviolet rays.

The phase shift patterns 501 or the upper layer for phase shift 500 may include a ruthenium (Ru) layer having a thickness of about 40 nm. It is confirmed that the extreme ultraviolet rays reflected from the phase shift pattern 501 of the ruthenium (Ru) layer have a phase difference of about 250 degrees (°) from the extreme ultraviolet rays reflected from the reflective layer 300. It is confirmed that the phase shift pattern 501 of the ruthenium (Ru) layer have a reflectivity of about 20% with respect to extreme ultraviolet.

The edge ring pattern 502 may include substantially the same phase shift layer as the phase shift patterns 501. The extreme ultraviolet rays reflected from the edge ring pattern 502 may have a phase difference from the extreme ultraviolet rays reflected from the neighboring reflective layer 300 portions. Accordingly, the edge ring pattern 502 may improve the resolution of the image of the pattern positioned at or adjacent to the boundary between the first region 101 and the second region 102 of the substrate 100. The edge ring pattern 502 may be formed as a pattern of a ring-shape or a loop-shape surrounding the phase shift patterns 501, as illustrated in FIG. 2.

Referring again to FIG. 1, the upper layer for phase shift 500 including the phase shift patterns 501 or the edge ring patterns 502 is spaced apart from the alignment holes 420, and most regions of the frame pattern 402 adjacent to the alignment hole 420 are exposed without being covered by the upper layer for phase shift 500. Accordingly, even though the phase shift pattern 501 or the upper layer for phase shift 500 has a relatively high reflectivity with respect to the inspection light (94A in FIG. 3), when scanning the alignment holes 420 with the inspection light (94A) and checking the positions of the alignment holes 420, it is possible to substantially exclude the influence of the check result by the upper layer for phase shift 500.

FIGS. 4 to 10 are schematic cross-sectional views illustrating a method of manufacturing a phase shift mask for extreme ultraviolet lithography according to an embodiment of the present disclosure.

Figure 4:
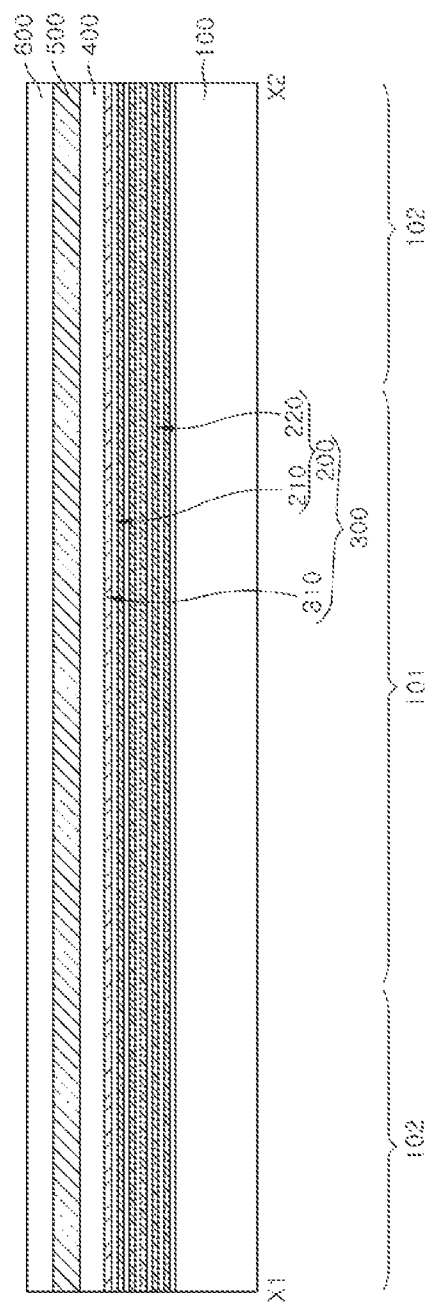
FIGS. 4, 5, 6, 7, 8, 9, and 10 are schematic views illustrating a method of manufacturing a phase shift mask for extreme ultraviolet lithography according to an embodiment of the present disclosure.

Referring to FIG. 4, a reflective layer 300 may be formed on a substrate 100. The substrate 100 may include a first region 101 and a second region 102. The first region 101 of the substrate 100 may be a central portion of the substrate 100, and the second region 102 of the substrate 100 may be an edge region surrounding the first region 101. The substrate 100 may be a base on which the reflective layer 300 is formed. The substrate 100 may include a low thermal expansion coefficient material (LTEM). The substrate 100 may include quartz, alumina silicate glass, or silicon oxide-titanium oxide ($SiO_2$—$TiO_2$) based glass.

The reflective layer 300 may be formed as a layer having a structure that reflects extreme ultraviolet rays, for example, a wavelength band of 13.5 nm. The reflective layer 300 may have a layer structure that implements a reflectivity of about 58% to 60% with respect to the incident extreme ultraviolet rays. The reflective layer 300 may include a multi-layer 200 in which a first reflective layer 210 and a second reflective layer 220 are alternately stacked a plurality of times. The first and second reflective layers 210 and 220 may be material layers having different refractive indices (n) with respect to extreme ultraviolet rays. The multi-layer 200 in which the first and second reflective layers 210 and 220 are alternately stacked may be formed in a mirror structure that reflects the incident extreme ultraviolet rays. The first reflective layer 210 may include a silicon (Si) layer, and the second reflective layer 220 may include a molybdenum (Mo) layer.

The reflective layer 300 may further include a capping layer 310 covering the multi-layer 200. The capping layer 310 may cover an upper surface of the multi-layer 200 to protect the multi-layer 200 from the external environment. The capping layer 310 may be made of a material having a low extinction coefficient (k) with respect to the extreme ultraviolet rays, for example, a material having an extinction coefficient of 0.005 to 0.04. The capping layer 310 may include a ruthenium (Ru) layer.

A lower layer 400 may be formed on the reflective layer 300. The lower layer 400 may include a low-reflection material layer having a relatively low reflectivity with respect to a light source in a wavelength range of about 248 nm to about 900 nm. The reflectivity of the lower layer 400 with respect to the light source in the wavelength range of about 248 nm to about 900 nm may be relatively lower than the reflectivity of the reflective layer 300 with respect to the light source in the wavelength range of about 248 nm to about 900 nm. The reflectivity of the lower layer 400 with respect to a light source in the wavelength range of about 405 nm and a light source in the wavelength range of about 880 nm may be relatively lower than the reflectivity of the reflective layer 300 with respect to a light source in the wavelength range of about 405 nm and a light source in the wavelength range of about 880 nm.

The reflectivity of the lower layer 400 with respect to a light source in the wavelength range of about 248 nm to about 900 nm may be lower than the reflectivity of the reflective layer 300 with respect to a light source in the wavelength range of about 248 nm to about 900 nm by about 50% or less. The reflectivity of the lower layer 400 with respect to a light source in the wavelength range of about 405 nm and a light source in the wavelength band of about 880 nm may be lower than the reflectivity of the reflective layer 300 with respect to a light source in the wavelength range of about 405 nm and a light source in the wavelength range of about 880 nm by about 50% or less.

The reflectivity of the lower layer 400 with respect to a light source in the wavelength range of approximately 248 nm to approximately 900 nm may be approximately 2% to 30%. The reflectivity of the lower layer 400 with respect to a light source in the wavelength band of about 405 nm and a light source in the wavelength band of about 880 nm may be about 2% to 30%.

The lower layer 400 may include a material layer including silicon nitride ($Si_3N_4$), silicon oxide ($SiO_2$), silicon oxynitride (SiON), tantalum oxide ($Ta_2O_5$), titanium oxide ($TiO_2$), hafnium oxide ($HfO_2$), or zirconium oxide ($ZrO_2$).

An upper layer for phase shift 500 may be formed on the lower layer 400. The upper layer for phase shift 500 may include a layer that reflects incident extreme ultraviolet rays. The upper layer for phase shift 500 may be formed as a phase shift layer in which the extreme ultraviolet rays reflected by the upper layer for phase shift 500 and the extreme ultraviolet rays reflected by the reflective layer 300 have a phase difference of 180 degrees (°) to 300 degrees (°). The upper layer for phase shift 500 may be formed as a phase shift layer having a reflectivity of 5% to 60% with respect to the extreme ultraviolet rays. The upper layer for phase shift 500 may be formed as a phase shift layer including a material having a refractive index of 0.87 to 0.96 and an extinction coefficient of 0.005 to 0.04 for extreme ultraviolet rays.

The upper layer for phase shift 500 may include a molybdenum (Mo) layer having a thickness of about 60 nm. The upper layer for phase shift 500 may include a ruthenium (Ru) layer having a thickness of about 40 nm.

A hard mask layer 600 may be formed on the upper layer for phase shift 500. The hard mask layer 600 may be used as a hard mask in the process of selectively etching the upper layer for phase shift 500 and the lower layer 400. The hard mask layer 600 may be omitted according to a subsequent selective etching process. The hard mask layer 600 may include a chromium (Cr) layer or a chromium nitride (CrN) layer. It is confirmed that the chromium (Cr) layer has a reflectivity of about 44% with respect to a light source in the wavelength of about 365 nm, has a reflectivity of about 42% with respect to a light source in the wavelength of about 405 nm, and has a reflectivity of about 43% with respect to a light source in the wavelength of about 880 nm.

As such, the chromium (Cr) layer has a relatively high reflectivity with respect to a wavelength band that can be used as inspection light (94A in FIG. 3), and thus may be used as the hard mask layer 600, but may be excluded from the structure of the phase shift mask (10 in FIG. 1). As illustrated in FIG. 3, when the phase shift mask 10 is loaded onto the mask loader 95 and the position of the phase shift mask 10 is checked, the inspection light reflected from the chrome (Cr) hard mask layer 600 may prevent checking the position of the alignment holes 420. Accordingly, the hard mask layer 600 may be removed by a separate removal process after the process of selectively etching the upper layer for phase shift 500 and the lower layer 400.

Figure 5:
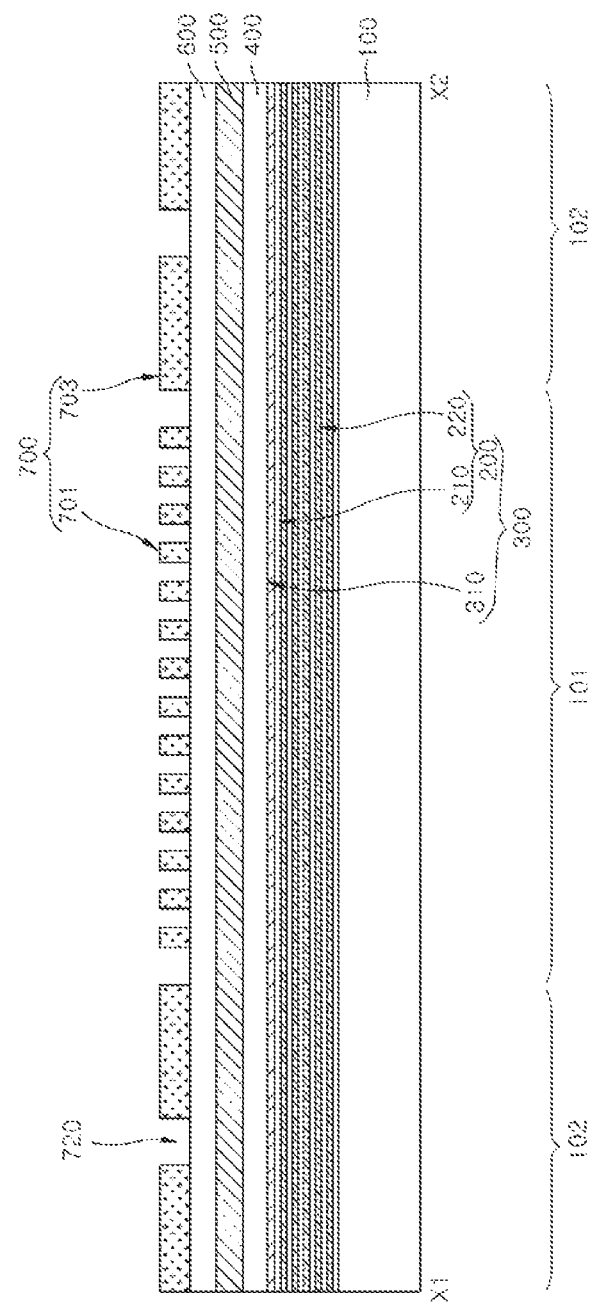

Referring to FIG. 5, a photoresist pattern 700 may be formed on the hard mask layer 600. The photoresist pattern 700 may be formed by forming a photoresist layer on the hard mask layer 600, performing an electron beam (e-beam) write process on the photoresist layer, and developing the photoresist layer. The photoresist pattern 700 may be formed as an etch mask for selectively etching the hard mask layer 600, the upper layer for phase shift 500, and the lower layer 400.

The photoresist pattern 700 may include first photoresist patterns 701 and second photoresist patterns 703 which are disposed to be spaced apart from each other for respective regions 101 and 102 of the substrate 100. The first photoresist patterns 701 may be positioned to overlap with the first region 101 of the substrate 100, and the second photoresist patterns 703 may be positioned to overlap with the second region 102 of the substrate 100. The first photoresist patterns 701 may have shapes to be image-transferred onto a wafer by an extreme ultraviolet lithography process. The second photoresist patterns 703 may be formed in patterns having openings 720 having shapes for forming alignment holes (420 in FIG. 1).

Figure 6:
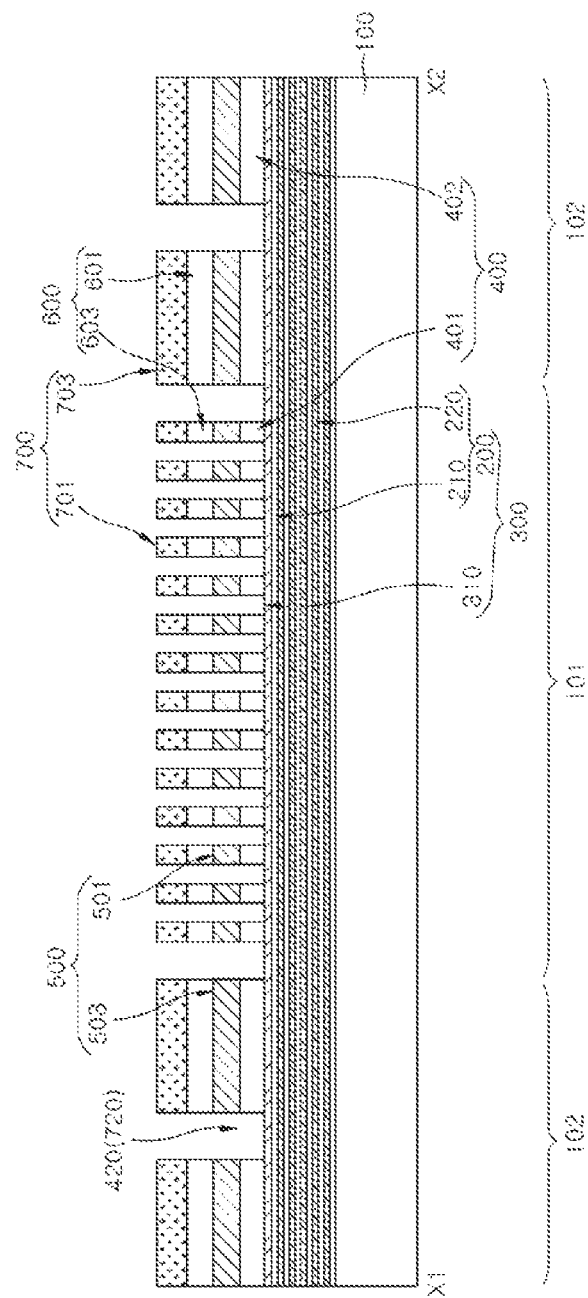

Referring to FIG. 6, a selective etching process using the photoresist pattern 700 as an etching mask may be performed. Using the photoresist pattern 700 as an etch mask, some portions of the upper layer for phase shift 500 and some portions of the lower layer 400 may be sequentially etched and removed.

First hard mask patterns 601 and second hard mask patterns 603 may be formed by selectively etching away some portions of the hard mask layer 600 using the photoresist pattern 700 as an etch mask. The first hard mask patterns 601 may overlap with the first photoresist patterns 701 and may be formed to have shapes conforming to the shapes of the first photoresist patterns 701. The second hard mask pattern 603 may overlap with the second photoresist patterns 703 and may be formed to have shapes conforming to the shapes of the second photoresist pattern 703. The first and second hard mask patterns 601 and 603 may be used as a portion of an etch mask assisting the photoresist pattern 700.

Using the photoresist pattern 700 and the first and second hard mask patterns 601 and 603 as etching masks, an etching process of sequentially removing some portions of the upper layer for phase shift 500 and some portions of the lower layer 400 may be continued. Accordingly, the first phase shift patterns 501 and the second phase shift patterns 503 may be patterned from the upper layer for phase shift 500. The first phase shift patterns 501 may overlap with the first hard mask patterns 601 or the first photoresist patterns 701, and may be patterned to have shapes conforming to the shapes of the first photoresist patterns 701. The second phase shift patterns 503 may overlap with the second hard mask patterns 603 or the second photoresist patterns 703, and may be patterned to have shapes conforming to the shapes of the second photoresist patterns 703. The second hard mask patterns 603 may be patterned in patterns providing alignment holes 420 formed along the shapes of the openings 720 or portions of the alignment holes 420.

Device patterns 401 and frame pattern 402 may be patterned from the lower layer 400. The device patterns 401 may overlap with the first phase shift patterns 501, the first hard mask patterns 601, or the first photoresist patterns 701, and may be patterned to have shapes conforming to the shapes of the first photoresist patterns 701. The frame pattern 402 may overlap with the second phase shift patterns 503, the second hard mask patterns 603, or the second photoresist patterns 703, and may be patterned to have a shape conforming to the shape of the second photoresist patterns 703. The frame patterns 402 may be patterned in patterns providing alignment holes 420 formed along the shapes of the openings 720 or portions of the alignment holes 420.

Figure 7:
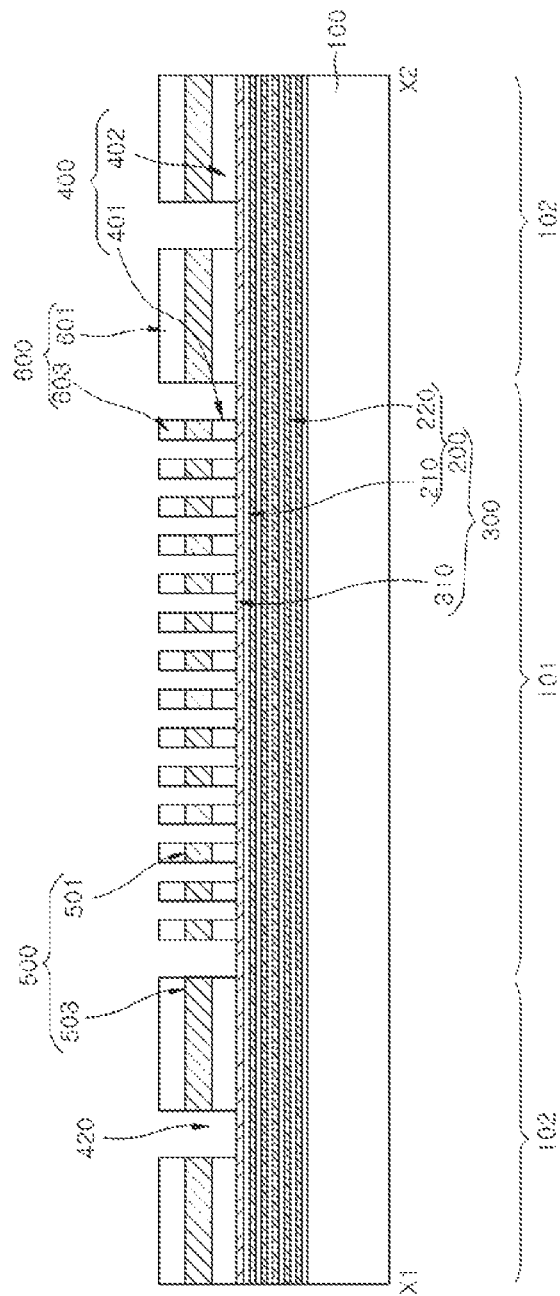

Referring to FIG. 7, the photoresist pattern (700 in FIG. 6) used as an etching mask may be selectively removed.

Figure 8:
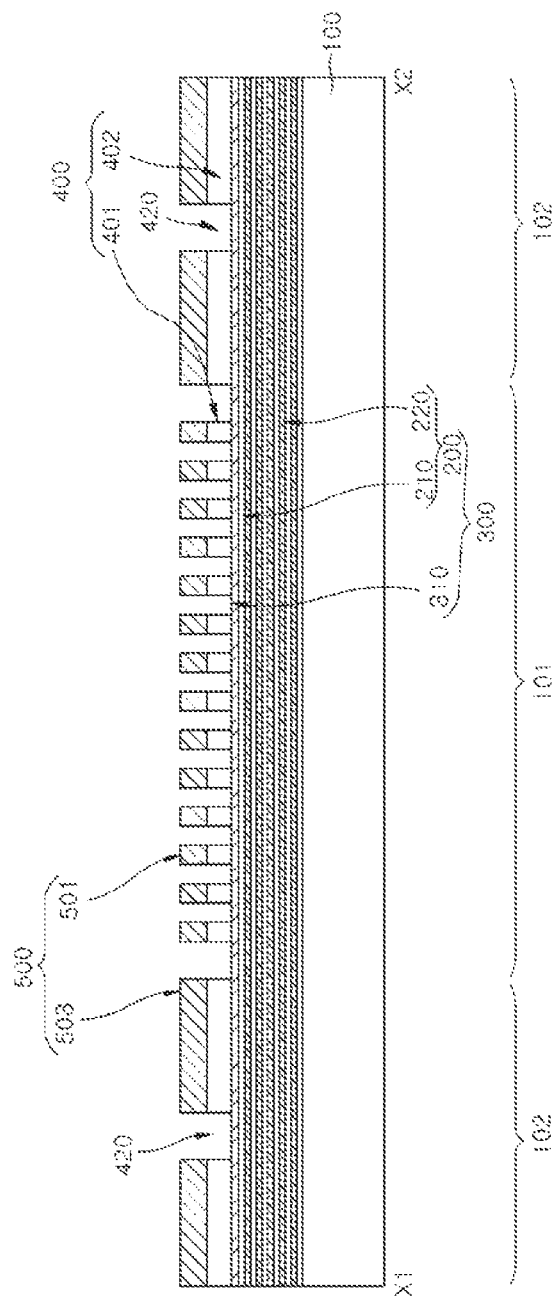

Referring to FIG. 8, the hard mask patterns (601 and 603 in FIG. 6) used as a portion of the etch mask may be selectively removed.

Figure 9:
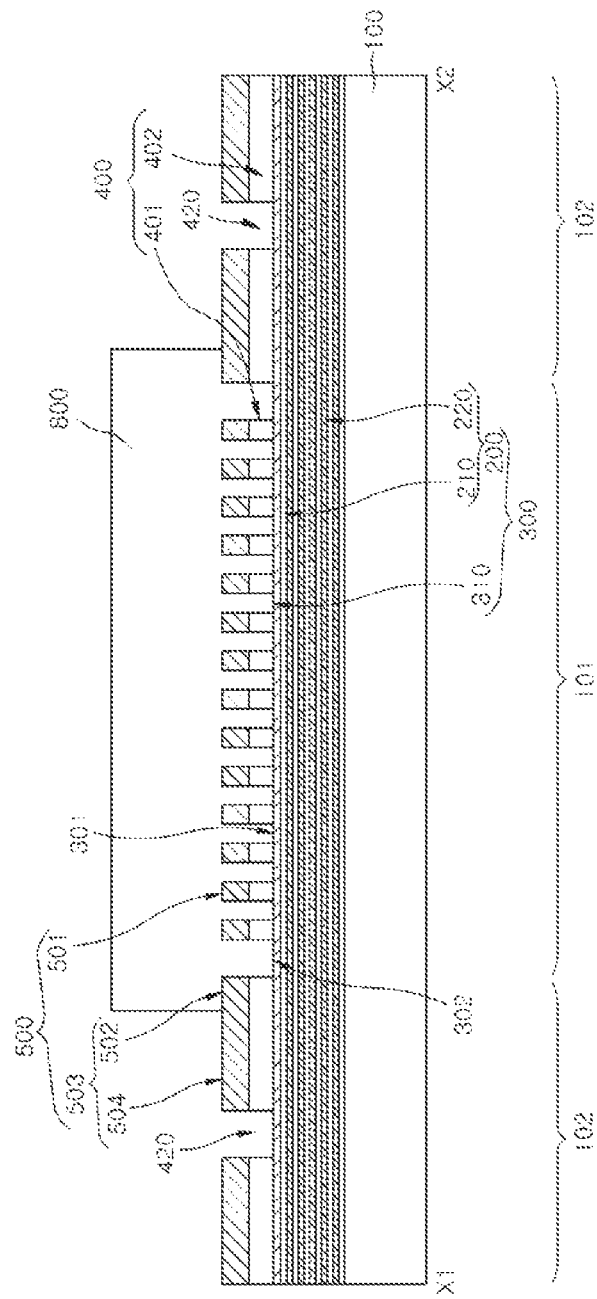

Referring to FIG. 9, a shielding pattern 800 exposing the second phase shift patterns 503 or a portion 504 of each of the second phase shift patterns may be formed. The shielding pattern 800 may cover or protect the first phase shift patterns 501. The shielding pattern 800 may cover or protect portions 301 of the reflective layer 300 between the first phase shift patterns 501. The shielding pattern 800 may cover or protect portions 302 of the reflective layer 300 between the first phase shift pattern 501 and the second phase shift pattern 503. The shielding pattern 800 may cover or protect a partial region 502 of the second phase shift pattern 503, facing the first phase shift pattern 501 while being adjacent to the first phase shift pattern 501.

The shielding pattern 800 may cover the portions 301 and 302 of the reflective layer 300, overlapping with the first region 101 of the substrate 100 and the first phase shift patterns 501 to protect the portions 301 and 302 of the reflective layer 300, overlapping with the first region 101 of the substrate 100 and the first phase shift patterns 501 from the external environment or a subsequent etching and removal process. The shielding pattern 800 may be formed in a pattern including a photoresist material. The shielding pattern 800 may be formed by coating, exposing, and developing the photoresist material. The shielding pattern 800 may expose the alignment holes 420 provided by the second phase shift patterns 503 and the portions 504 of the second phase shift patterns 503 adjacent to the alignment holes 420.

Figure 10:
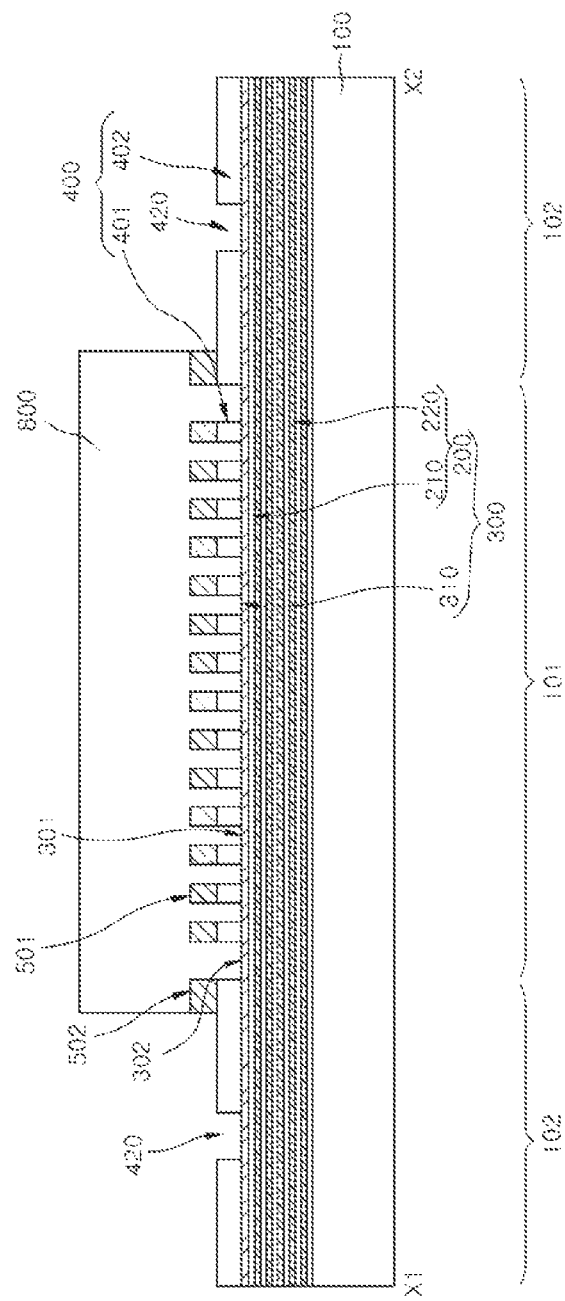

Referring to FIG. 10, an etching process using the shielding pattern 800 as an etching mask may be performed. The second phase shift patterns (503 in FIG. 9) or the partial portion 504 of the second phase shift pattern 503 exposed by the shielding pattern 800 may be selectively etched and removed. Accordingly, the frame patterns 402 may be exposed. When the shielding pattern 800 is extended to cover the partial regions 502 of the second phase shift pattern 503, the partial regions 502 of the second phase shift pattern 503 may remain as edge ring patterns 502.

The shielding pattern 800 may block and protect the first phase shift patterns 501 and the portions 301 and 303 of the reflective layer 300 overlapping the first region 101 of the substrate 100 from an etching environment that selectively removes the second phase shift patterns 503 or the portions 504 of the second phase shift patterns 503. Accordingly, in the process of selectively removing the second phase shift patterns 503 or the portions 504 of the second phase shift patterns 503, it is possible to effectively prevent or mitigate the first phase shift patterns 501 and the portions 301 and 303 of the reflective layer 300 overlapping with the first region 101 of the substrate 100 from being damaged. The shielding pattern 800 may effectively prevent or mitigate the portions of the capping layer 310 of the reflective layer 300 overlapping the first region 101 of the substrate 100 from being damaged.

The shielding pattern 800 may be selectively removed, and the surface from which the shielding pattern 800 has been removed may be cleaned. By such manufacturing processes, the phase shift mask 10 as illustrated in FIG. 1 may be implemented.

The various concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the various concepts are not limited to the above descriptions but defined by the accompanying claims, and all of distinctive features in the equivalent scope should be construed as being included in the concepts.

What is claimed is:

1. A phase shift mask comprising;
   a reflective layer formed on a substrate;
   device patterns formed on the reflective layer;
   a frame pattern formed on the reflective layer, the frame pattern including alignment holes exposing portions of the reflective layer; and
   phase shift patterns overlapping with the device patterns,
   wherein the frame pattern and the device patterns include substantially the same material layer, and
   wherein regions of the frame pattern adjacent to the alignment holes are exposed without overlapping with any of the phase shift patterns.

2. The phase shift mask of claim 1, wherein a reflectivity of the frame pattern with respect to a light source in a wavelength of 248 nanometers (nm) to 900 nm is lower than that of the reflective layer.

3. The phase shift mask of claim 1, wherein a reflectivity of the frame pattern with respect to the light source in the wavelength of 248 nm to 900 nm is 50 percent (%) or less than that of the reflective layer.

4. The phase shift mask of claim 1, wherein a reflectivity of the frame pattern with respect to the light source in the wavelength of 248 nm to 900 nm is 2% to 30%.

5. The phase shift mask of claim 1, wherein the frame pattern includes at least one selected from the group consisting of ruthenium (Ru), silicon (Si), molybdenum (Mo), tantalum (Ta), titanium (Ti), and zirconium (Zr).

6. The phase shift mask of claim 1, wherein the frame pattern includes at least one selected from the group consisting of silicon nitride ($Si_3N_4$), silicon oxide ($SiO_2$), silicon oxynitride (SiON), tantalum oxide ($Ta_2O_5$), titanium oxide ($TiO_2$), hafnium oxide ($HfO_2$), and zirconium oxide ($ZrO_2$).

7. The phase shift mask of claim 1, wherein the phase shift patterns are formed so that extreme ultraviolet rays reflected by the phase shift patterns and extreme ultraviolet rays reflected by the reflective layer have a phase difference of 180 degrees (°) to 300 degrees (°).

8. The phase shift mask of claim 1, wherein the phase shift patterns include a phase shift layer including at least one selected from the group consisting of ruthenium (Ru), molybdenum (Mo), niobium (Nb), tantalum (Ta), titanium (Ti), and zirconium (Zr).

9. The phase shift mask of claim 8, wherein the phase shift layer further includes at least one of carbon (C), oxygen (O), and nitrogen (N).

10. The phase shift mask of claim 1, wherein the phase shift patterns have the reflectivity of 5% to 60% with respect to extreme ultraviolet.

11. The phase shift mask of claim 1, wherein the phase shift patterns have a refractive index of 0.87 to 0.96 and an extinction coefficient of 0.005 to 0.04 with respect to extreme ultraviolet.

12. The phase shift mask of claim 1, wherein the reflective layer includes:
   a multi-layer in which first and second reflective layers having different refractive indices with respect to extreme ultraviolet are alternately stacked; and
   a capping layer covering the multi-layer.

13. The phase shift mask of claim 12,
wherein the first reflective layer includes a silicon (Si) layer,
wherein the second reflective layer includes a molybdenum (Mo) layer, and
wherein the capping layer includes a ruthenium (Ru) layer.

14. The phase shift mask of claim 1, wherein the frame pattern is a perimeter configured to surround the device patterns.

* * * * *